United States Patent
Takano et al.

(10) Patent No.: US 10,148,006 B2
(45) Date of Patent: Dec. 4, 2018

(54) THERMOPLASTIC RESIN COMPOSITION, RESIN MOLDED ARTICLE, AND METHOD FOR MANUFACTURING RESIN MOLDED ARTICLE HAVING A PLATED LAYER

(71) Applicant: MITSUBISHI ENGINEERING-PLASTICS CORPORATION, Tokyo (JP)

(72) Inventors: Takahiro Takano, Kanagawa (JP);
Takahiko Sumino, Kanagawa (JP);
Kentarou Ishihara, Tokyo (JP);
Naohisa Akashi, Tokyo (JP)

(73) Assignee: MITSUBISHI ENGINEERING-PLASTICS CORPORATION, Tokyo (JP)

( * ) Notice: Subject to any disclaimer, the term of this patent is extended or adjusted under 35 U.S.C. 154(b) by 651 days.

(21) Appl. No.: 14/428,125

(22) PCT Filed: Sep. 5, 2013

(86) PCT No.: PCT/JP2013/073952
§ 371 (c)(1),
(2) Date: Mar. 13, 2015

(87) PCT Pub. No.: WO2014/042070
PCT Pub. Date: Mar. 20, 2014

(65) Prior Publication Data
US 2015/0244066 A1    Aug. 27, 2015

(30) Foreign Application Priority Data
Sep. 14, 2012  (JP) ................................. 2012-203369

(51) Int. Cl.
*C08L 101/00* (2006.01)
*H01Q 1/38* (2006.01)
(Continued)

(52) U.S. Cl.
CPC ............... *H01Q 1/38* (2013.01); *B29C 59/16* (2013.01); *B41M 5/267* (2013.01);
(Continued)

(58) Field of Classification Search
CPC .... C08K 7/14; C08K 3/22; C08K 2203/2227; C08K 2003/2248; C08K 2003/2255;
(Continued)

(56) References Cited

U.S. PATENT DOCUMENTS 5,928,780 A    7/1999  Schmidt et al.
6,214,917 B1   4/2001  Linzmeier et al.
(Continued)

FOREIGN PATENT DOCUMENTS

CN    1902055 A      1/2007
CN    101186739 A    5/2008
(Continued)

OTHER PUBLICATIONS

Extended European Search Report, dated Apr. 8, 2016, for European Application No. 13836370.0.
(Continued)

*Primary Examiner* — Jane L Stanley
(74) *Attorney, Agent, or Firm* — Birch, Stewart, Kolasch & Birch, LLP

(57) ABSTRACT

Provided is a thermoplastic resin composition that allows a plated layer to be successfully formed on a surface of resin molded article obtained therefrom under a wide range of laser irradiation condition. A thermoplastic resin composition comprising a thermoplastic resin, and 1 to 30 parts by weight of a laser direct structuring additive and 0.1 to 10 parts by weight of a laser marking additive per 100 parts by weight of the thermoplastic resin, wherein the laser direct structuring additive comprises 70% by weight or more of a tin oxide.

15 Claims, 1 Drawing Sheet

(51) Int. Cl.

| | | |
|---|---|---|
| *C08K 3/22* | (2006.01) | |
| *H01Q 1/24* | (2006.01) | |
| *C08G 69/26* | (2006.01) | |
| *C08K 7/14* | (2006.01) | |
| *C08L 77/06* | (2006.01) | |
| *C23C 18/16* | (2006.01) | |
| *C23C 18/20* | (2006.01) | |
| *B29C 59/16* | (2006.01) | |
| *C23C 18/38* | (2006.01) | |
| *B41M 5/26* | (2006.01) | |
| *H05K 3/18* | (2006.01) | |
| *C08L 53/02* | (2006.01) | |
| *B29K 101/12* | (2006.01) | |
| *B29K 509/08* | (2006.01) | |
| *B29L 31/34* | (2006.01) | |
| *H05K 1/03* | (2006.01) | |
| *H05K 1/09* | (2006.01) | |
| *H05K 1/16* | (2006.01) | |

(52) U.S. Cl.
CPC .............. *C08G 69/265* (2013.01); *C08K 3/22* (2013.01); *C08K 7/14* (2013.01); *C08L 53/02* (2013.01); *C08L 77/06* (2013.01); *C23C 18/1608* (2013.01); *C23C 18/1612* (2013.01); *C23C 18/1641* (2013.01); *C23C 18/204* (2013.01); *C23C 18/38* (2013.01); *H01Q 1/243* (2013.01); *H05K 3/185* (2013.01); *B29K 2101/12* (2013.01); *B29K 2509/08* (2013.01); *B29L 2031/3456* (2013.01); *C08K 3/2279* (2013.01); *C08K 2003/2227* (2013.01); *C08K 2003/2231* (2013.01); *C08K 2003/2248* (2013.01); *C08K 2003/2255* (2013.01); *C08K 2003/2296* (2013.01); *H05K 1/0366* (2013.01); *H05K 1/0373* (2013.01); *H05K 1/09* (2013.01); *H05K 1/165* (2013.01); *H05K 2201/0215* (2013.01); *H05K 2201/0326* (2013.01); *H05K 2201/10098* (2013.01); *H05K 2203/107* (2013.01)

(58) Field of Classification Search
CPC .... C08K 2003/2231; C08K 2003/2296; C08K 3/2279
USPC .......................................................... 524/606
See application file for complete search history.

(56) References Cited

U.S. PATENT DOCUMENTS

| | | | |
|---|---|---|---|
| 6,696,173 B1 | 2/2004 | Naundorf et al. | |
| 7,187,398 B2 | 3/2007 | Carroll, Jr. et al. | |
| 8,318,051 B2 | 11/2012 | Adachi et al. | |
| 8,603,600 B2* | 12/2013 | Mitadera | C08G 69/26 428/35.7 |
| 9,050,843 B2 | 6/2015 | Duijnhoven Van et al. | |
| 9,334,365 B2* | 5/2016 | Mitadera | C08G 69/26 |
| 9,587,316 B2* | 3/2017 | Takano | C08K 7/14 |
| 2005/0137305 A1 | 6/2005 | Carroll, Jr. et al. | |
| 2006/0083939 A1 | 4/2006 | Dunbar et al. | |
| 2008/0113861 A1 | 5/2008 | Watanabe et al. | |
| 2009/0292051 A1* | 11/2009 | Li | C08K 3/0008 524/404 |
| 2010/0227122 A1* | 9/2010 | Kumazawa | B29C 45/0001 428/156 |
| 2011/0251326 A1 | 10/2011 | Van Hartingsveldt et al. | |
| 2014/0002311 A1 | 1/2014 | Takano et al. | |
| 2014/0147682 A1 | 5/2014 | Takano et al. | |
| 2014/0353543 A1* | 12/2014 | Wu | C08K 5/20 252/75 |
| 2015/0353714 A1* | 12/2015 | Takano | C23C 18/1608 428/458 |
| 2016/0135296 A1* | 5/2016 | Takano | B23K 1/0056 361/760 |

FOREIGN PATENT DOCUMENTS

| | | | |
|---|---|---|---|
| CN | 101788765 A | 7/2010 | |
| CN | 101903182 A | 12/2010 | |
| JP | 8-81839 A | 3/1996 | |
| JP | 9-12776 A | 1/1997 | |
| JP | 10-500149 A | 1/1998 | |
| JP | 2000-503817 A | 3/2000 | |
| JP | 2004-534408 A | 11/2004 | |
| JP | 2007-65110 A | 3/2007 | |
| JP | 2007-512215 A | 5/2007 | |
| JP | 2006-124701 A | 5/2008 | |
| JP | 2008-201050 A | 9/2008 | |
| JP | 2010-274530 A | 12/2010 | |
| JP | 2010-638947 A | 12/2010 | |
| JP | 5340513 B1 | 11/2013 | |
| WO | WO 2005/000969 A1 | 1/2005 | |
| WO | WO 2009/141800 A2 | 11/2009 | |
| WO | WO 2012/056385 A1 | 5/2012 | |
| WO | WO 2012/056416 A1 | 5/2012 | |
| WO | WO 2012/128219 A1 | 9/2012 | |
| WO | WO 2013/183789 A1 | 12/2013 | |

OTHER PUBLICATIONS

Chinese Office Action and Search Report dated Aug. 2, 2016, for Chinese Application No. 201380043368.X, including an English translation of the Chinese Office Action.
Chinese Office Action, dated Feb. 4, 2017, for Chinese Application No. 201380043368.X, with English translation.
Japanese Office Action, dated Feb. 21, 2017, for Japanese Application No. 2014-535515, with English machine translation.
Chinese Office Action and Search Report dated Dec. 24, 2015, for Chinese Application No. 201380043368.X with the English translation of the Office Action.
Zhou, "Chinese and Foreign Modified Additives for Plastics Handbook," China Machine Press, Nov. 2009, pp. 151-155.
International Preliminary Report on Patentability and Written Opinion of the International Searching Authority (Forms PCT/IB/338, PCT/IB/373,PCT/ISA/237 and PCT/IB/326) for International Application No. PCT/JP2013/073952, dated Mar. 26, 2015, with an English translation.
International Search Report and Written Opinion of the International Searching Authority (Forms PCT/ISA/210 and PCT/ISA/237) for International Application No. PCT/JP2013/073952, dated Nov. 26, 2013.

* cited by examiner

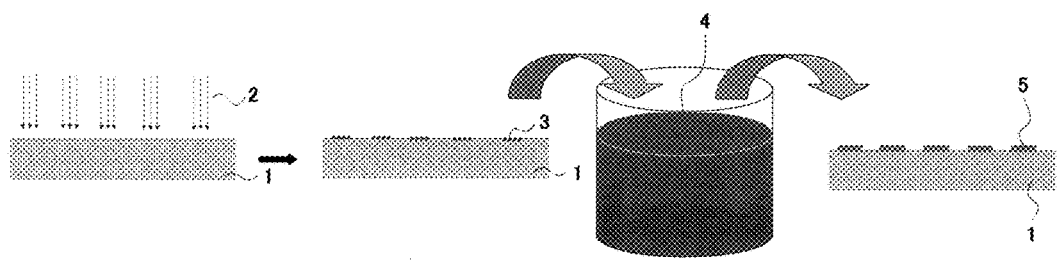

THERMOPLASTIC RESIN COMPOSITION, RESIN MOLDED ARTICLE, AND METHOD FOR MANUFACTURING RESIN MOLDED ARTICLE HAVING A PLATED LAYER

TECHNICAL FIELD

The present invention relates to a thermoplastic resin composition. It also relates to resin a molded article obtained by molding the thermoplastic resin composition, and a method for manufacturing a resin molded article having a plated layer formed on the surface of the resin molded article.

BACKGROUND ART

With recent development of cell phones including smartphones, various processes for manufacturing antennas inside the cell phones have been proposed. Especially, it would be desirable to provide a method for manufacturing an antenna that can be three-dimensionally designed in a cell phone. The laser direct structuring (hereinafter sometimes referred to as "LDS") technology has drawn attention as one of technologies for forming such three-dimensional antennas. The LDS technology refers to a technology for forming a plated layer by, for example, irradiating the surface of a resin molded article containing an LDS additive with a laser beam to activate only the region irradiated with the laser beam and applying a metal on the activated region. This technology is characterized in that metal structures such as antennas can be directly manufactured on the surface of resin substrates without using any adhesive or the like. The LDS technology is disclosed in, for example, patent documents 1 to 3 and the like.

REFERENCES

Patent Documents

Patent document 1: JP-A2000-503817
Patent document 2: JP-A2004-534408
Patent document 3: International Publication WO2009/141800.

SUMMARY OF THE INVENTION

Problems to be Solved by the Invention

On the other hand, it would also be desirable to improve productivity when a plated layer is formed on the surface of resin molded articles obtained by molding thermoplastic resin compositions. Thus, it would be desirable to successfully forma plated layer under a wide range of laser irradiation conditions.

The present invention aims to solve the problems of the prior art described above, thereby providing thermoplastic resin compositions that allow a plated layer to be successfully formed on the surface of resin molded articles obtained therefrom under a wide range of laser irradiation conditions.

Means to Solve the Problems

Under these circumstances, as a result of the inventors careful studies, we achieved the present invention on the basis of the finding that the problems described above can be solved by adding an LDS additive containing 70% by weight or more of a tin oxide and a laser marking additive to a thermoplastic resin. Specifically, the problems described above were solved by the following means <1>, preferably <2> to <14>.

<1> A thermoplastic resin composition comprising a thermoplastic resin, and 1 to 30 parts by weight of a laser direct structuring additive and 0.1 to 10 parts by weight of a laser marking additive per 100 parts by weight of the thermoplastic resin, wherein the laser direct structuring additive comprises 70% by weight or more of a tin oxide.

<2> The thermoplastic resin composition according to <1>, which comprises 10 to 200 parts by weight of an inorganic fiber per 100 parts by weight of the thermoplastic resin.

<3> The thermoplastic resin composition according to <2>, wherein the inorganic fiber comprises a glass fiber.

<4> The thermoplastic resin composition according to any one of <1> to <3>, wherein the laser marking additive comprises at least one kind selected from an oxide containing copper and molybdenum, and an oxide containing bismuth and gallium and/or neodymium.

<5> The thermoplastic resin composition according to <4>, wherein the laser marking additive comprises an oxide containing copper and molybdenum.

<6> The thermoplastic resin composition according to any one of <1> to <5>, wherein the thermoplastic resin comprises a polyamide resin.

<7> The thermoplastic resin composition according to any one of <1> to <6>, wherein the laser direct structuring additive comprises at least one kind selected from an oxide containing antimony and tin, and an oxide containing aluminum and zinc.

<8> A resin molded article obtained by molding the thermoplastic resin composition according to any one of <1> to <7>.

<9> The resin molded article according to <8>, further comprising a plated layer on a surface.

<10> The resin molded article according to <8> or <9>, which is a part for portable electronic devices.

<11> The resin molded article according to <9> or <10>, wherein the plated layer has performance as an antenna.

<12> A method for manufacturing a resin molded article having a plated layer, comprising irradiating a surface of a resin molded article obtained by molding the thermoplastic resin composition according to any one of claims 1 to 7 with a laser beam, and then applying a metal to form a plated layer.

<13> The method for manufacturing a resin molded article having a plated layer according to <12>, wherein the plated layer is a copper plated layer.

<14> A method for manufacturing a part for portable electronic devices, comprising a method for manufacturing a resin molded article having a plated layer according to <12> or <13>.

Advantages of the Invention

The present invention made it possible to provide thermoplastic resin compositions that allow a plated layer to be successfully formed on the surface of resin molded articles obtained therefrom under a wide range of laser irradiation conditions. Thus, productivity can be improved when a plated layer is formed on the surface of resin molded articles obtained by molding the thermoplastic resin compositions provided by the present invention.

BRIEF EXPLANATION OF THE DRAWINGS

FIG. 1 is a schematic diagram showing a process for plating the surface of a resin molded article.

THE MOST PREFERRED EMBODIMENTS OF THE INVENTION

The present invention will be explained in detail below. As used herein, each numerical range expressed by two values on both sides of "to" is used to mean the range including the values indicated before and after "to" as lower and upper limits.

<Thermoplastic Resin Composition>

The thermoplastic resin composition of the present invention is characterized in that the thermoplastic resin composition comprises a thermoplastic resin, and 1 to 30 parts by weight of an LDS additive and 0.1 to 10 parts by weight of a laser marking additive per 100 parts by weight of the thermoplastic resin, characterized in that the LDS additive comprises 70% by weight or more of a tin oxide.

<Thermoplastic Resin>

The thermoplastic resin composition of the present invention comprises a thermoplastic resin. The type of the thermoplastic resin is not specifically limited, and examples include polycarbonate resins, alloys of polyphenylene ether resins and polystyrene resins, alloys of polyphenylene ether resins and polyamide resins, thermoplastic polyester resins, methyl methacrylate/acrylonitrile/butadiene/styrene copolymer resins, methyl methacrylate/styrene copolymer resins, methyl methacrylate resins, rubber-reinforced methyl methacrylate resins, polyamide resins, polyacetal resins, polylactic resins, polyolefin resins and the like.

In the present invention, polyamide resins and thermoplastic polyester resins are preferably used, more preferably polyamide resins. The thermoplastic resins may be used alone or as a combination of two or more of them.

Polyamide resins are polyamide polymers that contain an acid amide group (—CONH—) in the molecule and that can be melted by heating. Specifically, the polyamide resin includes various polyamide resins such as polycondensates of lactams, polycondensates of diamine compounds with dicarboxylic acid compounds, polycondensates of ω-aminocarboxylic acids and the like, or copolyamide resins or blends thereof and the like.

Lactams that can be polycondensed into polyamide resins include, for example, ε-caprolactam, ω-laurolactam and the like.

Diamine compounds include, for example, aliphatic, alicyclic and aromatic diamines such as tetramethylenediamine, hexamethylenediamine, undecamethylenediamine, dodecamethylenediamine, 2-methylpentamethylenediamine, 2,2,4- or 2,4,4-trimethylhexamethylenediamine, 5-methylnonamethylenediamine, m-xylylenediamine (MXDA), p-xylylenediamine, 1,3-bis(aminomethyl)cyclohexane, 1,4-bis(aminomethyl)cyclohexane, 1-amino-3-aminomethyl-3,5,5-trimethylcyclohexane, bis(4-aminocyclohexyl)methane, bis(3-methyl-4-aminocyclohexyl)methane, 2,2-bis(4-aminocyclohexyl)propane, bis(aminopropyl)piperazine, aminoethylpiperazine and the like.

Dicarboxylic acid compounds include, for example, aliphatic, alicyclic and aromatic dicarboxylic acids such as adipic acid, suberic acid, azelaic acid, sebacic acid, dodecanedioic acid, terephthalic acid, isophthalic acid, 2-chloroterephthalic acid, 2-methylterephthalic acid, 5-methylisophthalic acid, 5-sulfoisophthalic acid, hexahydroterephthalic acid, hexahydroisophthalic acid and the like.

ω-Aminocarboxylic acids include, for example, amino acids such as 6-aminocaproic acid, 11-aminoundecanoic acid, 12-aminododecanoic acid, p-aminomethylbenzoic acid and the like.

Specific examples of polyamide resins obtained by polycondensing these materials include polyamide 4, polyamide 6, polyamide 11, polyamide 12, polyamide 46, polyamide 66, polyamide 610, polyamide 612, polyhexamethylene terephthalamide (polyamide 6T), polyhexamethylene isophthalamide (polyamide 6I), poly(m-xylylene adipamide) (polyamide MXD6), poly(m-xylylene dodecamide), polyamide 9T, polyamide 9MT and the like. In the present invention, these polyamide homopolymers or copolymers can be used alone or as a mixture thereof.

Among the polyamide resins described above, polyamide 6, polyamide 66, or xylylenediamine polyamide resins (MX nylons) obtained by polycondensation of straight-chain aliphatic α,ω-dibasic acids with xylylenediamines are more preferably used to improve moldability and heat resistance. Among them, MX nylons are more preferred to improve heat resistance and flame retardance. When the polyamide resins are used as a mixture, the proportion of MX nylons in the polyamide resins is preferably 50% by weight or more, more preferably 80% by weight or more.

MX nylons are preferably used in combination with aliphatic polyamide resins such as polyamide 66, polyamide 6, polyamide 46, polyamide 9T and the like to shorten the molding cycle because MX nylons crystallize somewhat more slowly than aliphatic polyamide resins. Aliphatic polyamide resins used to shorten the molding cycle include rapidly crystallizing polyamide resins such as polyamide 66, polyamide 6, polyamide 46, polyamide 9T and the like and polyamide resins having a high melting point such as polyamides 66/6T, 66/6T/6I and the like, among which polyamide 66 or polyamide 6 is preferred from an economic viewpoint. The balance between moldability and physical properties, the content of the aliphatic polyamide resins is preferably less than 50%, more preferably 1 to 20 wt % by weight of all polyamide resins. The content of the aliphatic polyamide resins by less than 50 wt %, it is possible to maintain the heat resistance better.

Straight-chain aliphatic α,ω-dibasic acids that can be preferably used as one raw material of MX nylons are straight-chain aliphatic α,ω-dibasic acids containing 6 to 20 carbon atoms such as adipic acid, sebacic acid, suberic acid, dodecanedioic acid, eicosadienoic acid and the like. Among these straight-chain aliphatic α,ω-dibasic acids, sebacic acid is especially preferred in terms of moldability, the balance among performances of molded articles and the like.

Xylylenediamines used as the other raw material of MX nylons include m-xylylenediamine or xylylenediamine mixtures of p-xylylenediamine and m-xylylenediamine. The molar ratio of m-xylylenediamine and p-xylylenediamine (m-xylylenediamine/p-xylylenediamine) in the xylylenediamine mixtures is preferably 55/45 to 100/0, more preferably 70/30 to 100/0. The molar proportion of p-xylylenediamine is preferably less than 45 mol % because the melting point of the polyamide resins can be kept low, which makes it easy to polymerize the MX nylons or to mold compositions containing the MX nylons.

Description about thermoplastic polyester resins can be found in paragraphs 0013 to 0016 of JP-A2010-174223, and the contents of which are incorporated herein by reference. For example, polyester resins include a polybutylene terephtalate resin, or a mixture containing 60% by weight or more, preferably 80% by weight or more of a polybutylene terephthalate resin.

The amount of the thermoplastic resin contained in the thermoplastic resin composition of the present invention is preferably 35% by weight or more, more preferably 40% by weight or more in total.

<LDS Additive>

As used herein, the term "LDS additive" refers to a compound that allows a thermoplastic resin (for example, the polyamide resin synthesized in the Examples described later) to be plated with a metal when 10 parts by weight of the compound as a possible LDS additive is added per 100 parts by weight of the resin and the resin is irradiated with a YAG laser beam having a wavelength of 1064 nm at an output power of 13 W, a frequency of 20 kHz, and a scanning speed of 2 m/s, and then subjected to a plating process to apply the metal on the surface irradiated with the laser beam in the electroless plating bath MID Copper 100 XB Strike from MacDermid. The LDS additive used in the present invention may be synthesized or commercially available. In addition to commercially available products sold for use as LDS additives, those sold for other purposes may also be used so far as they meet the requirements for the LDS additive in the present invention.

A first embodiment of the LDS additive used in the present invention comprises a tin oxide as a main component at a level of 70% by weight or more, e.g., 75% by weight or more.

The LDS additive according to the first embodiment is an oxide containing antimony and/or phosphorus and tin, preferably an oxide containing antimony and tin. The use of such an LDS additive can improve the plating properties of resin molded articles so that the surface of the resin molded articles can be successfully plated. A single LDS additive may be used or two or more LDS additives may be used in combination.

More preferably, the LDS additive according to the first embodiment contains tin in excess of phosphorus and/or antimony, even more preferably contains 80% by weight or more of tin based on the total amount of tin, phosphorus and antimony.

Especially, the LDS additive according to the first embodiment is preferably an oxide containing antimony and tin, more preferably an oxide containing tin in excess of antimony, even more preferably an oxide containing 80% by weight or more of tin based on the total amount of tin and antimony.

Specifically, the LDS additive according to the first embodiment includes, for example, a tin oxide doped with antimony, a tin oxide doped with an antimony oxide, a tin oxide doped with phosphorus, or a tin oxide doped with a phosphorus oxide, preferably a tin oxide doped with antimony or a tin oxide doped with an antimony oxide, more preferably a tin oxide doped with an antimony oxide. For example, the phosphorus content in LDS additives containing phosphorus and a tin oxide is preferably 1 to 20% by weight. Similarly, the antimony content in LDS additives containing antimony and a tin oxide is preferably 1 to 20% by weight. Further, the phosphorus content and the antimony content in LDS additives containing phosphorus, antimony and a tin oxide are preferably 0.5 to 10% by weight and 0.5 to 10% by weight, respectively.

The LIDS additive used in a second embodiment of the present invention preferably comprises a conductive oxide containing at least two metals and having a resistivity of $5 \times 10^3$ $\Omega \cdot cm$ or less. The resistivity of the conductive oxide is preferably $8 \times 10^2$ $\Omega \cdot cm$ or less, more preferably $7 \times 10^2$ $\Omega \cdot cm$ or less, even more preferably $5 \times 10^2$ $\Omega \cdot cm$ or less. The lower limit is not specifically defined, but can be, for example, $1 \times 10^1$ $\Omega \cdot cm$ or more, even $1 \times 10^2$ $\Omega \cdot cm$ or more.

As used herein, the resistivity of the conductive oxide typically refers to powder resistivity, which can be measured with the tester "model 3223" from Yokogawa Electric Corporation by loading 10 g of fine powder of the conductive oxide into a cylinder having an internal diameter of 25 mm coated with Teflon on the inside and pressurizing it at 100 $kg/cm^2$ (packing density 20%).

The LDS additive used in the second embodiment is not specifically limited so far as it comprises a conductive oxide having a resistivity of $5 \times 10^3$ $\Omega \cdot cm$ or less, but preferably contains at least two metals, specifically contains a metal of Group n (wherein n is an integer of 3 to 16) and a metal of Group n+1 of the periodic table. Preferably, n is an integer of 10 to 13, more preferably 12 or 13.

The LDS additive used in the second embodiment preferably contains 15 mol % or less, more preferably 12 mol % or less, especially preferably 10 mol % or less of one of a metal of Group n (wherein n is an integer of 3 to 16) and a metal of Group n+1 of the periodic table provided that the total amount of both metals in the LDS additive is 100 mol %. The lower limit is not specifically defined, but should be 0.0001 mol % or more. When two or more metals are contained in such ranges, plating properties can be improved. In the present invention, an oxide of a metal of Group n doped with a metal of Group n+1 is especially preferred.

Further, the metal of Group n and the metal of Group n+1 of the periodic table described above preferably account for 98% by weight or more of the metal components contained in the LDS additive used in the second embodiment.

Metals of Group n of the periodic table include, for example, metals of Group 3 (scandium, yttrium), Group 4 (titanium, zirconium and the like), Group 5 (vanadium, niobium and the like), Group 6 (chromium, molybdenum and the like), Group 7 (manganese and the like), Group 8 (iron, ruthenium and the like), Group 9 (cobalt, rhodium, iridium and the like), Group 10 (nickel, palladium, platinum), Group 11 (copper, silver, gold and the like), Group 12 (zinc, cadmium and the like), Group 13 (aluminum, gallium, indium and the like), Group 14 (germanium, tin and the like), Group 15 (arsenic, antimony and the like), and Group 16 (selenium, tellurium and the like), as well as oxides of these metals and the like. Among others, metals of Group 12 (n=12) or oxides thereof are preferred, more preferably zinc.

Metals of Group n+1 of the periodic table include, for example, metals of Group 4 (titanium, zirconium and the like), Group 5 (vanadium, niobium and the like), Group 6 (chromium, molybdenum and the like), Group 7 (manganese and the like), Group 8 (iron, ruthenium and the like), Group 9 (cobalt, rhodium, iridium and the like), Group 10 (nickel, palladium, platinum), Group 11 (copper, silver, gold and the like), Group 12 (zinc, cadmium and the like), Group 13 (aluminum, gallium, indium and the like), Group 14 (germanium, tin and the like), Group 15 (arsenic, antimony and the like), and Group 16 (selenium, tellurium and the like), as well as oxides of these metals and the like. Among others, metals of Group 13 (n+1=13) or oxides thereof are preferred, more preferably aluminum or gallium, even more preferably aluminum.

The LDS additive used in the second embodiment may contain metals other than the conductive metal oxide. Examples of metals other than the conductive oxide include antimony, titanium, indium, iron, cobalt, nickel, cadmium, silver, bismuth, arsenic, manganese, chromium, magnesium, calcium and the like. These metals may exist as their oxides. These metals are each preferably contained in an amount of 0.01% by weight or less of the LDS additive.

In addition, from view of improving the L value, the LDS additive used in the second embodiment preferably contains antimony in an amount of 3% by weight or less, more preferably 1% by weight or less, even more preferably 0.01% by weight or less, especially preferably substantially free from antimony based on the LDS additive. As used herein, substantially free from antimony means that the component of interest is not contained at any levels that would influence the advantages of the present invention.

The LDS additive used in the present invention preferably has an average particle size of 0.01 to 100 μm, more preferably 0.05 to 10 μm. When it has such an average particle size, the homogeneity of the state of plated surfaces can be more improved.

The amount of the LDS additive contained in the thermoplastic resin composition of the present invention should be 1 to 30 parts by weight, preferably 2 to 25 parts by weight, more preferably 10 to 22 parts by weight per 100 parts by weight of the thermoplastic resin. When the LDS additive is contained in an amount within such ranges, plating properties can be more improved. Further, plating can be achieved with smaller amounts of the LDS additive by using talc in combination with the LDS additive, as described later.

<Laser Marking Additive>

The thermoplastic resin composition of the present invention comprises a laser marking additive. The thermoplastic resin composition of the present invention comprises a laser marking additive along with the LDS additive, whereby they absorb laser beams more readily as compared with thermoplastic resin compositions containing no laser marking additive. Thus, the resin on the surface of resin molded articles prepared from the thermoplastic resin composition of the present invention can be removed to expose the LDS additive when the resin molded articles are irradiated with a laser beam. The exposed LDS additive becomes liable to laser irradiation with the result that a plated layer can be successfully formed on the surface of the resin molded articles prepared from the thermoplastic resin composition of the present invention under a wider range of laser irradiation conditions than conventionally applied. Especially, plating can be achieved with even lower doses of laser so that productivity can be improved.

The laser marking additive used in the present invention is not specifically limited. For example, it satisfies the following criteria. When the PAMP6 resin employed in the Examples described below is combined with 2 parts by weight of a possible laser marking additive and molded into a film having a thickness of 200 μm in a press and the resulting film is irradiated with a laser beam under predetermined conditions on a plate containing carbon black, printing can be achieved on the surface of the film while nothing will be printed on the plate containing carbon black.

Such laser marking additives specifically include oxides containing copper and molybdenum; oxides containing bismuth and gallium and/or neodymium; pigments composed of a substrate of flaky mica coated with a tin oxide doped with antimony, arsenic, bismuth, copper, gallium, germanium or an oxide thereof; and polymer materials containing copper hydroxide monophosphate or a molybdenum oxide. Further, the laser marking additives may be used alone or as a combination of two or more of them.

Among these laser marking additives, preferred are those comprising at least one kind selected from an oxide containing copper and molybdenum, and an oxide containing bismuth and gallium and/or neodymium, especially preferably an oxide containing copper and molybdenum. The oxide containing copper and molybdenum is preferably $CuMoO_4$. Further, the oxide containing bismuth and gallium and/or neodymium is preferably represented by the general formula (1) below:

$$Bi_{(1-x)}M_xO_y \qquad \text{general formula (1)}$$

In formula (1), M represents gallium and/or neodymium, and x and y are values satisfying the relations $0.001<x<0.5$ and $1<y<2.5$, respectively.

In addition to those described above, laser marking additives used in the present invention include those described in JP-A2007-146059, JP-A2008-045051, JP-A2009-102541, JP-A2010-095396, JP-A2010-194906 and the like, the contents of which are incorporated herein by reference.

The laser marking additive used in the present invention preferably has an average particle size of 0.01 to 50 μm, more preferably 0.1 to 10 μm.

The amount of the laser marking additive contained in the thermoplastic resin composition of the present invention is typically 0.05 to 10 parts by weight, preferably 0.1 to 8 parts by weight, more preferably 0.5 to 6 parts by weight per 100 parts by weight of the thermoplastic resin.

<Inorganic Fiber>

The thermoplastic resin composition of the present invention may further comprise an inorganic fiber. The incorporation of an inorganic fiber can further improve mechanical strength. In addition, the incorporation of an inorganic fiber can also further improve dimensional precision. A single type of inorganic fiber may be used or two or more types of inorganic fiber may be used in combination.

Inorganic fibers include, for example, glass fiber, milled fiber, alumina fiber, potassium titanate whisker and the like, as well as metal fibers such as steel fiber, stainless steel fiber and the like, especially preferably glass fiber.

The glass fiber preferably used in the present invention preferably has an average diameter of 20 μm or less, more preferably 1 to 15 μm to further improve the balance among physical properties (strength, rigidity, rigidity after heating, impact strength) and to further reduce molding warpage. Further, glass fibers that are generally used often typically have a circular section, but the present invention is not specifically limited to such a sectional shape, and those having a cocoon-shaped, elliptical or rectangular section, for example, can also be used.

The glass fiber is not specifically limited to any length, and can be used by selecting it from long fiber bundles (rovings), short fiber bundles (chopped strands) and the like. Such types of glass fiber bundles are each preferably composed of 100 to 5000 fibers. Further, the glass fiber may be a milled strand known as so-called milled fiber or glass powder or a single continuous strand called sliver so far as the glass fiber has an average length of 0.1 mm or more in the thermoplastic resin compositions after they have been kneaded.

The composition of the raw glass is preferably an alkali-free composition such as E-glass, C-glass, S-glass or the like, among which E-glass is preferred in the present invention. Preferably, the glass fiber has been surface-treated with a silane coupling agent such as γ-methacryloxypropyltrimethoxysilane, γ-glycidoxypropyltrimethoxysilane, γ-aminopropyltriethoxysilane or the like, and the amount deposited is typically 0.01 to 1% by weight of the glass fiber.

Further, the glass fiber may be used after the glass fiber has been surface-treated as appropriate with a lubricant such as a fatty acid amide compound, a silicone oil or the like; an antistatic agent such as a quaternary ammonium salt or the like; a resin having a film-coating ability such as an epoxy resin, a urethane resin or the like; or a mixture of a resin having a film-coating ability with a heat stabilizer or with a flame retardant or the like.

The amount of the inorganic fiber contained in the thermoplastic resin composition of the present invention is typically 10 to 200 parts by weight, preferably 20 to 180 parts by weight, more preferably 30 to 150 parts by weight per 100 parts by weight of the thermoplastic resin. Further, the thermoplastic resin and the inorganic fiber preferably account for 80% by weight or more of all components in the thermoplastic resin compositions of the present invention.

<Talc>

The thermoplastic resin composition of the present invention may further comprise talc. The incorporation of talc can improve dimensional stability and product appearance, and also improve the plating properties of resin molded articles so that the resin molded articles can be successfully plated even if the LDS additive is added in smaller amounts. Talc may be used after the talc has been surface-treated with at least one of compounds selected from polyorganohydrogen siloxanes and organopolysiloxanes. In this case, the amount of the siloxane compounds deposited on talc is preferably 0.1 to 5% by weight of talc.

The amount of talc contained in the thermoplastic resin composition of the present invention is preferably 0.01 to 50 parts by weight, more preferably 1 to 30 parts by weight, even more preferably 5 to 15 parts by weight per 100 parts by weight of the thermoplastic resin compositions. When talc has been surface-treated with a siloxane compound, the amount of talc surface-treated with the siloxane compound should preferably fall within the ranges defined above.

<Elastomer>

The thermoplastic resin composition of the present invention may further comprise an elastomer. The incorporation of an elastomer can improve the impact resistance of the thermoplastic resin composition.

The elastomer used in the present invention is preferably a graft copolymer obtained by graft copolymerization of a rubber component with a monomer component that can be copolymerized with the rubber component. The graft copolymer may be prepared by any processes such as mass polymerization, solution polymerization, suspension polymerization, emulsion polymerization and the like, and may be prepared by single-stage or multistage graft copolymerization.

The rubber component typically has a glass transition temperature of 0° C. or less, preferably −20° C. or less, more preferably −30° C. or less. Specific examples of rubber components include polybutadiene rubbers; polyisoprene rubbers; poly(alkyl acrylate) rubbers such as poly(butyl acrylate), poly(2-ethylhexyl acrylate), butyl acrylate/2-ethylhexyl acrylate copolymers and the like; silicone rubbers such as polyorganosiloxane rubbers; butadiene-acrylic composite rubbers; IPN (Interpenetrating Polymer Network) composite rubbers composed of a polyorganosiloxane rubber and a polyalkyl acrylate rubber; styrene-butadiene rubbers; ethylene-α-olefin rubbers such as ethylene-propylene rubbers, ethylene-butene rubbers, ethylene-octene rubbers and the like; ethylene-acrylic rubbers; fluororubbers; and the like. These may be used alone or as a mixture of two or more of them. Among them, polybutadiene rubbers, polyalkyl acrylate rubbers, polyorganosiloxane rubbers, IPN composite rubbers composed of a polyorganosiloxane rubber and a polyalkyl acrylate rubber, and styrene-butadiene rubbers are preferred to improve mechanical properties and surface appearance.

Specific examples of monomer components that can be graft-copolymerized with the rubber components include aromatic vinyl compounds; vinyl cyanate compounds; (meth)acrylic acid ester compounds; (meth)acrylic acid compounds; epoxy-containing (meth)acrylic acid ester compounds such as glycidyl (meth)acrylate; maleimide compounds such as maleimide, N-methylmaleimide and N-phenylmaleimide; α,β-unsaturated carboxylic acid compounds such as maleic acid, phthalic acid and itaconic acid and their anhydrides (e.g., maleic anhydride and the like), etc. These monomer components may be used alone or as a combination of two or more of them. Among them, aromatic vinyl compounds, vinyl cyanate compounds, (meth) acrylic acid ester compounds, and (meth)acrylic acid compounds are preferred to improve mechanical properties and surface appearance, more preferably (meth)acrylic acid ester compounds. Specific examples of (meth)acrylic acid ester compounds include methyl (meth)acrylate, ethyl (meth)acrylate, butyl (meth)acrylate, cyclohexyl (meth)acrylate, octyl (meth)acrylate and the like.

The graft copolymer obtained by copolymerizing a rubber component is preferably a core-shell graft copolymer to improve impact resistance and surface appearance. Among others, especially preferred are core-shell graft copolymers comprising a core layer consisting of at least one rubber component selected from polybutadiene-containing rubbers, polybutyl acrylate-containing rubbers, polyorganosiloxane rubbers, and IPN composite rubbers composed of a polyorganosiloxane rubber and a polyalkyl acrylate rubber, and a shell layer formed by copolymerizing a (meth) acrylic acid ester around it. The core-shell graft copolymer preferably contains 40% by mass or more, more preferably 60% by mass or more of the rubber component. Further, it preferably contains 10% by mass or more of (meth)acrylic acid. It should be noted that the core-shell as used herein covers the concept widely encompassing compounds obtained by graft polymerization of a rubber component around a core-forming part though the core layer and the shell layer may not necessarily be definitely demarcated.

Preferred specific examples of these core-shell graft copolymers include methyl methacrylate-butadiene-styrene copolymers (MBS), methyl methacrylate-acrylonitrile-butadiene-styrene copolymers (MABS), methyl methacrylate-butadiene copolymers (MB), methyl methacrylate-acrylic rubber copolymers (MA), methyl methacrylate-acrylic rubber-styrene copolymers (MAS), methyl methacrylate-acrylic/butadiene rubber copolymers, methyl methacrylate-acrylic/butadiene rubber-styrene copolymers, methyl methacrylate-(acrylic/silicone IPN rubber) copolymers, styrene-ethylene-butadiene-styrene copolymers and the like. Such rubber polymers may be used alone or as a combination of two or more of them.

The amount of the elastomer contained in the thermoplastic resin composition of the present invention is preferably 0.1 to 40% by weight, more preferably 0.5 to 25% by weight, even more preferably 1 to 10% by weight.

<Mold Release Agent>

The thermoplastic resin composition of the present invention may further comprise a mold release agent. The mold release agent is mainly used to improve productivity during molding of the resin composition. Mold release agents include, for example, aliphatic carboxylic acid amides, aliphatic carboxylic acids, esters of aliphatic carboxylic acids and alcohols, aliphatic hydrocarbon compounds having a number average molecular weight of 200 to 15000, polysiloxane silicone oils and the like. Among these mold release agents, carboxylic acid amide compounds are especially preferred.

Aliphatic carboxylic acid amides include, for example, compounds obtained by a dehydration reaction of a higher aliphatic monocarboxylic acid and/or polybasic acid with a diamine.

Higher aliphatic monocarboxylic acids preferably include saturated aliphatic monocarboxylic acids and hydroxycarboxylic acids containing 16 or more carbon atoms such as palmitic acid, stearic acid, behenic acid, montanic acid, 12-hydroxystearic acid and the like.

Polybasic acids include, for example, aliphatic dicarboxylic acids such as malonic acid, succinic acid, adipic acid, sebacic acid, pimelic acid and azelaic acid; aromatic dicarboxylic acids such as phthalic acid and terephthalic acid; alicyclic dicarboxylic acids such as cyclohexanedicarboxylic acid, cyclohexylsuccinic acid and the like.

Diamines include, for example, ethylenediamine, 1,3-diaminopropane, 1,4-diaminobutane, hexamethylenediamine, m-xylylenediamine, tolylenediamine, p-xylylenediamine, phenylenediamine, isophoronediamine and the like.

Carboxylic acid amide compounds preferably include compounds obtained by polycondensing stearic acid, sebacic acid and ethylenediamine, more preferably compounds obtained by polycondensing 2 moles of stearic acid, 1 mole of sebacic acid and 2 moles of ethylenediamine. Further, bisamide compounds obtained by reacting a diamine with an aliphatic carboxylic acid such as N,N'-methylenebisstearic acid amide or N,N'-ethylenebisstearic acid amide as well as dicarboxylic acid amide compounds such as N,N'-dioctadecylterephthalic acid amide can also be preferably used.

Aliphatic carboxylic acids include, for example, saturated or unsaturated aliphatic mono-, di- or tricarboxylic acids. The aliphatic carboxylic acids here also include alicyclic carboxylic acids. Among them, preferred aliphatic carboxylic acids are mono- or dicarboxylic acids containing 6 to 36 carbon atoms, more preferably saturated aliphatic monocarboxylic acids containing 6 to 36 carbon atoms. Specific example of such aliphatic carboxylic acids include palmitic acid, stearic acid, caproic acid, capric acid, lauric acid, arachic acid, behenic acid, lignoceric acid, cerotic acid, melissic acid, tetratriacontanoic acid, montanic acid, adipic acid, azelaic acid, etc.

Aliphatic carboxylic acids that can be used in esters of aliphatic carboxylic acids and alcohols include, for example, the aliphatic carboxylic acids listed above. Alcohols include, for example, saturated or unsaturated mono- or polyalcohols. These alcohols may be substituted by a substituent such as a fluorine atom or an aryl group. Among them, saturated mono- or polyalcohols containing 30 or less carbon atoms are preferred, more preferably saturated aliphatic or alicyclic monoalcohols or saturated aliphatic polyalcohols containing 30 or less carbon atoms.

Specific examples of such alcohols include octanol, decanol, dodecanol, stearyl alcohol, behenyl alcohol, ethylene glycol, diethylene glycol, glycerol, pentaerythritol, 2,2-dihydroxyperfluoropropanol, neopentylene glycol, ditrimethylolpropane, dipentaerythritol and the like.

Specific examples of esters of aliphatic carboxylic acids and alcohols include beeswax (a mixture containing myricyl palmitate as a major component), stearyl stearate, behenyl behenate, stearyl behenate, glyceryl monopalmitate, glyceryl monostearate, glyceryl distearate, glyceryl tristearate, pentaerythritol monopalmitate, pentaerythritol monostearate, pentaerythritol distearate, pentaerythritol tristearate, pentaerythritol tetrastearate and the like.

Aliphatic hydrocarbons having a number average molecular weight of 200 to 15,000 include, for example, liquid paraffin, paraffin waxes, microcrystalline waxes, polyethylene waxes, Fischer-Tropsch waxes, α-olefin oligomers containing 3 to 12 carbon atoms and the like. It should be noted that the aliphatic hydrocarbons here also include alicyclic hydrocarbons. Preferably, the aliphatic hydrocarbons have a number average molecular weight of 5,000 or less.

The amount of the mold release agent contained is typically 0.001 parts by weight or more, preferably 0.01 parts by weight or more, and typically 2 parts by weight or less, preferably 1.5 parts by weight or less per 100 parts by weight of the total of the thermoplastic resin and the glass fiber. When the mold release agent is contained at 0.001 parts by weight or more per 100 parts by weight of the total of the thermoplastic resin and the glass fiber, releasability can be improved. When the mold release agent is contained at 2 parts by weight or less per 100 parts by weight of the total of the thermoplastic resin and the glass fiber, a decrease in hydrolysis resistance can be prevented and mold contamination during injection molding can also be prevented.

<Alkali>

The thermoplastic resin composition of the present invention may further comprise an alkali. When the LDS additive used in the present invention is an acidic material (pH 6 or less, for example), it may be reduced depending on the combination so that the resulting resin molded articles may be unevenly colored, but they can be more evenly colored by adding an alkali.

The type of the alkali that can be used is not specifically limited, but includes, for example, calcium hydroxide (Ca(OH)$_2$) or magnesium hydroxide (Mg(OH)$_2$). A single alkali may be used or two or more alkalis may be used in combination.

The amount of the alkali contained in the thermoplastic resin composition of the present invention depends on the type of the LDS additive and the type of the alkali, but preferably ranges from 0.01 to 15% by weight of the amount of the LDS additive, more preferably 1 to 10% by weight of of the amount of the LDS additive.

<Other Additives>

The thermoplastic resin composition of the present invention may further comprise various additives so far as the advantages of the present invention are not affected. Such additives include heat stabilizers, flame retardants, light stabilizers, antioxidants, UV absorbers, dyes/pigments, fluorescent brightening agents, anti-dripping agents, antistatic agents, anti-fogging agents, lubricants, anti-blocking agents, flow improvers, plasticizers, dispersants, antibacterial agents and the like. These components may be used alone or as a combination of two or more of them.

<Method for Manufacturing the Thermoplastic Resin Composition>

Any methods can be employed for the method for manufacturing the thermoplastic resin composition of the present invention. For example, a method comprises mixing a thermoplastic resin, an LDS additive and a glass fiber by using a mixing means such as a V-blender to prepare a batch blending, and then melting/kneading the batch in a vented extruder to pelletize the batch. An alternative method is a two-step kneading process comprising thoroughly mixing the components and the like except for the glass fiber in advance, then melting/kneading the mixture in a vented extruder to prepare pellets, then mixing the pellets with the glass fiber, and finally melting/kneading the mixture in the vented extruder.

Still another process comprises thoroughly mixing the components and the like except for the glass fiber in a V-blender or the like to prepare a mixture in advance and feeding this mixture from a first shoot of a vented twin-screw extruder while feeding the glass fiber from a second shoot in the midway of the extruder and melting/kneading the mixture of all components to pelletize the mixture.

The screw layout in the kneading zone of the extruder preferably comprises an upstream element for promoting kneading and a downstream element capable of increasing pressure.

Elements for promoting kneading include forward kneading disc elements, neutral kneading disc elements, wide kneading disc elements, and forward mixing screw elements and the like.

The heating temperature during melting/kneading can be typically selected from the range of 180 to 360° C. as appropriate. If the temperature is too high, decomposition gases may be readily released to cause opacification. Thus, the screw layout should desirably be chosen by taking into account shear heating and the like. Further, antioxidants or heat stabilizers desirable to be used to inhibit decomposition during kneading and a subsequent molding process.

The method for manufacturing a resin molded article is not specifically limited, and any molding techniques commonly adopted for thermoplastic resin composition can be employed. Examples of such techniques include injection molding, ultra-high speed injection molding, injection compression molding, two-color molding, gas-assisted or other hollow molding, molding techniques using thermally insulated molds, molding techniques using rapidly heated molds, expansion molding (including the use of supercritical fluids), insert molding, IMC (In-Mold Coating) molding techniques, extrusion molding, sheet molding, heat molding, rotational molding, laminate molding, press molding, blow molding and the like. Further, molding techniques using hot runner systems can also be used.

<Method for Manufacturing the Resin Molded Article Having a Plated Layer>

Next, the method for manufacturing the resin molded article having a plated layer of the present invention will be explained, specifically a method for plating a surface of a resin molded article obtained by molding the thermoplastic resin composition of the present invention will be explained with reference to FIG. 1.

FIG. 1 is a schematic diagram showing a process for plating the surface of a resin molded article 1 by the laser direct structuring technology. In FIG. 1, the resin molded article 1 is shown as a flat substrate, but may not be necessarily a flat substrate and instead a resin molded article having a partially or totally curved surface. Further, the resin molded article 1 may not be an end product, but includes various parts.

The resin molded article 1 in the present invention is preferably a part for portable electronic devices. The part for portable electronic devices has not only high impact resistance and rigidity but also excellent heat resistance as well as low anisotropy and low warpage so that the resin molded article it is very effective as an internal structure and a chassis for electronic organizers, PDAs such as hand-held computers and electronic databook; pagers, cell phones, PHS phones and the like. In particular, the resin molded article is suitable for use as a flat part for portable electronic devices when the molded article has an average thickness of 1.2 mm or less excluding ribs (and, for example, 0.4 mm or more, though the lower limit is not specifically defined), and it is especially suitable for use as a chassis.

Referring again to FIG. 1, the resin molded article 1 is irradiated with a laser beam 2 in the process for preparing a resin molded article having a plated layer of the present invention.

The source of the laser beam 2 is not specifically limited, and can be appropriately selected from known lasers such as YAG lasers, excimer lasers, electromagnetic radiation and the like, especially preferably YAG lasers. Further, the wavelength of the laser beam 2 is not specifically limited, either. A preferred wavelength range of the laser beam 2 is 200 nm to 1200 nm, especially preferably 800 to 1200 nm.

Once the resin molded article 1 is irradiated with the laser beam 2, the resin molded article 1 is activated only in the region 3 irradiated with the laser beam 2. A plating solution 4 is applied to the resin molded article 1 in the activated state. The plating solution 4 is not specifically limited, and known plating solutions can be widely employed, preferably plating solutions containing a metal component such as copper, nickel, gold, silver or palladium, more preferably copper.

The method by which the plating solution 4 is applied to the resin molded article 1 is not specifically limited either, but involves, for example, placing the article into a liquid containing the plating solution. After the plating solution has been applied to the resin molded article 1, a plated layer 5 is formed only on the region irradiated with the laser beam 2.

According to the processes of the present invention, circuits can be formed at distances of 1 mm or less, even 150 µm or less from each other (and, for example, 30 µm or more though the lower limit is not specifically defined). Such circuits are preferably used as antennas for portable electronic devices. Thus, an example of a preferred embodiment of the resin molded article 1 of the present invention is a resin molded article having a plated layer for use as a part for portable electronic devices wherein the plated layer has performance as an antenna.

Additionally, references can be made to the descriptions in JP-A2011-219620, JP-A2011-195820, JP-A2011-178873, JP-A2011-168705, and JP-A2011-148267 without departing from the spirit of the present invention.

EXAMPLES

The present invention will further be detailed below referring to Examples. Materials, amount of use, ratio, details of processes, procedures of process and so forth described in Examples below may be modified arbitrarily, without departing from the spirit of the present invention. Accordingly, the scope of the present invention should not be construed to be limited by Examples below.

<Polyamide Resin>
(Synthesis of a Polyamide (PAMP10))

In a reaction vessel under a nitrogen atmosphere, sebacic acid was melted by heating and then the temperature was raised to 235° C. while a diamine mixture of p-xylylenediamine (from MITSUBISHI GAS CHEMICAL COMPANY, INC.) and m-xylylenediamine (from MITSUBISHI GAS CHEMICAL COMPANY, INC.) in a molar ratio of 3:7 was gradually added dropwise under pressure (0.35 Mpa) while stirring the contents until the molar ratio of diamine to sebacic acid reached about 1:1. After completion of the dropwise addition, the reaction was continued for 60 minutes to control the amount of components having a molecular weight of 1000 or less. After completion of the reaction, the contents were collected in the form of strands and pelletized in a pelletizer to give a polyamide hereinafter referred to as "PAMP10".

(Synthesis of a Polyamide (PAMP6))

In a reaction vessel under a nitrogen atmosphere, adipic acid (from Rhodia) was melted by heating and then the temperature was raised to 270° C. while a diamine mixture of p-xylylenediamine (from MITSUBISHI GAS CHEMICAL COMPANY, INC.) and m-xylylenediamine (from MITSUBISHI GAS CHEMICAL COMPANY, INC.) in a molar ratio of 3:7 was gradually added dropwise under pressure (0.35 Mpa) while stirring the contents until the molar ratio of diamine to adipic acid reached about 1:1. After completion of the dropwise addition, the pressure was lowered to 0.06 MPa and the reaction was continued for 10 minutes to control the amount of components having a molecular weight of 1,000 or less. Then, the contents were collected in the form of strands and pelletized in a pelletizer to give a polyamide hereinafter referred to as "PAMP6", which had a melting point of 256° C.

<LDS Additives>

T-1-20L: A tin-antimony oxide (consisting of 80% $SnO_2$ and 20% $Sb_2O_5$; antimony content 15.1% by weight, water content 1.5%, pH=3.4) (from Mitsubishi Materials Corporation).

23K: An aluminum-doped zinc oxide having a resistivity (nominal) of 100 to 500 Ω·cm from HakusuiTech Co., Ltd.

<Laser Marking Additives>

42-903A: An oxide containing copper and molybdenum ($CuMoO_4$) and having a particle size of 1.5 μm (from Tokan Material Technology Co., Ltd.).

42-920A: An oxide containing bismuth and neodymium ($Bi_2O_3$: 98 to 99%, $Nd_2O_3$:0.3 to 1%) and having a particle size of 1.0 μm (from Tokan Material Technology Co., Ltd.).

<Inorganic Fiber>

03T-296tH: A glass fiber (from Nippon Electric Glass Co., Ltd.).

<Talc>

Micron White 5000S (from Hayashi-Kasei Co., Ltd.).

<Elastomer>

SEBS: FT1901GT (from Kraton Performance Polymers, Inc.).

<Mold Release Agent>

CS8CP (from NITTO KASEI KOGYO K.K.)

<Alkali>

$Ca(OH)_2$.

<Talc>

MW5000S: talc from Hayashi-Kasei Co., Ltd.

<Compounds>

Various components were weighed in the compositions shown in the tables below, and all components excluding the inorganic fiber were blended in a tumbler and introduced into a twin-screw extruder (TEM26SS from TOSHIBA MACHINE CO., LTD.) from the rear ends of the screws and melted, and then the inorganic fiber was supplied from a side feeder to prepare resin pellets. The extruder was operated at a temperature setting of 280° C.

Plating Properties

Examples 1 to 3, Comparative Example 1

Each resin composition was molded by filling it into the cavity of a mold of 60×60 mm having a thickness of 2 mm from a fan gate having a width of 60 mm and a thickness of 1.5 mm at a resin temperature of 280° C. and a mold temperature of 110° C. The gate portion was cut off to give a plating test specimen.

An area of 10×10 mm of the plating test specimen obtained was irradiated using the laser irradiation system VMc1 from Trumpf (a YAG laser with a wavelength of 1064 nm and a maximum output power of 15 W) at an output power of 6 W or 8 W, a frequency of 60 kHz or 80 kHz, and a scanning speed of 4 m/s. This was followed by a plating process in the electroless plating bath ENPLATE LDS CU-400 PC from Enthone at 48° C. Plating performance was visually determined from the thickness of the layer of copper deposited in 20 minutes.

Plating properties including laser condition range and plating appearance were evaluated according to the following criteria. The results are shown in Table 1.

<<Laser Condition Range>>

○: A plated layer has been uniformly formed under any conditions.

Δ: A plated layer has not been uniformly formed under some conditions (acceptable for practical uses).

×: A plated layer has not been uniformly formed under a half or more of the conditions.

<<Plating Appearance>>

The best of the appearances observed under four combinations of the conditions described above (laser irradiation conditions using the following combinations: an output power of 6 W and a frequency of 60 kHz; an output power of 6 W and a frequency of 80 kHz; an output power of 8 W and a frequency of 60 kHz; and an output power of 8 W and a frequency of 80 kHz) was evaluated according to the following criteria.

○: Good appearance (a thick plated layer has been formed as proved by a deep copper color).

Δ: A plated layer has been formed, though it is somewhat thin (acceptable for practical uses).

×: No plated layer has been formed.

Plating Properties

Examples 4 and 5, Comparative Example 2

Each resin composition was molded by filling it into the cavity of a mold of 60×60 mm having a thickness of 2 mm from a fan gate having a width of 60 mm and a thickness of 1.5 mm at a resin temperature of 280° C. and a mold temperature of 110° C. The gate portion was cut off to give a plating test specimen.

The plating test specimen having a thickness of 2 mm was used to evaluate its plating properties. An area of 5 mm×5 mm was irradiated using the laser irradiation system LP-Z SERIES from SUNX Co., Ltd. (a YAG laser with a wavelength of 1064 nm and a maximum output power of 13 W) at a scanning speed of 2 m/s, and at (1) an output power of 20% for a pulse duration of 20 μs (microseconds), (2) an output power of 20% for a pulse duration of 50 μs, (3) an output power of 80% for a pulse duration of 20 μs, or (4) an output power of 80% for a pulse duration of 50 This was followed by a plating process using the electroless plating bath MID Copper 100 XB Strike from MacDermid at 60° C. for 60 minutes.

In the same manner as described above, the specimen was evaluated for its laser condition range and plating appearance.

TABLE 1

|  |  |  | Example 1 | Example 2 | Example 3 | Comparative example 1 |
|---|---|---|---|---|---|---|
| Thermoplastic resin | PAMP10 | Parts by weight | 100 | 100 | 100 | 100 |
| LDS additive | T-1-20L |  | 13.5 | 18.0 | 15.8 | 18.0 |
| Laser marking additives | 42-903A |  | 4.5 | 4.5 |  |  |
|  | 42-920A |  |  |  | 2.3 |  |
| Inorganic fiber | 03T-296GH |  | 90.1 | 90.1 | 90.1 | 90.1 |
| Talc | MW5000S |  | 9.0 | 4.5 | 9.0 | 9.0 |
| Elastomer | FT1901GT |  | 6.8 | 6.8 | 6.8 | 6.8 |
| Mold release agent | CS8CP |  | 0.7 | 0.7 | 0.7 | 0.7 |
| Alkali | $Ca(OH)_2$ |  | 0.7 | 0.7 | 0.7 | 0.7 |
| Plating properties | Laser condition range |  | ○ | ○ | ○ | x |
|  | Plating appearance |  | ○ | ○ | Δ | ○ |

TABLE 2

|  |  |  | Example 4 | Example 5 | Comparative example 2 |
|---|---|---|---|---|---|
| Thermoplastic resin | PAMP6 | Parts by weight | 100.0 | 100.0 | 100.0 |
| LDS additive | 23K |  | 10.0 | 20.0 | 20.0 |
| Laser marking additive | 42-903A |  | 4.0 | 4.0 |  |
| Glass fiber | 03T-296GH |  | 80.0 | 80.0 | 80.0 |
| Mold release agent | CS8CP |  | 0.6 | 0.6 | 0.6 |
| Talc | MW5000S |  | 2.0 | 2.0 | 2.0 |
| Plating properties | Laser condition range |  | Δ | Δ | x |
|  | Plating appearance |  | ○ | ○ | Δ |

The results of Table 1 show that a plated layer can be formed under a wide range of irradiation conditions and excellent plating appearance has been achieved with the thermoplastic resin compositions obtained in Examples 1 to 3 because they comprise a thermoplastic resin and 1 to 30 parts by weight of an LDS additive and 0.1 to 10 parts by weight of a laser marking additive per 100 parts by weight of the thermoplastic resin and the LDS additive comprises 70% by weight or more of a tin oxide.

However, it is shown that the irradiation conditions under which a plated layer can be successfully formed with the thermoplastic resin composition obtained in Comparative example 1 are considerably limited as compared with Examples 1 to 3 because it does not contain any laser marking additive.

The results of Table 2 show that a plated layer can be formed under a relatively wide range of irradiation conditions and excellent plating appearance has been achieved with the thermoplastic resin compositions obtained in Examples 4 and 5 because they comprise a thermoplastic resin and 1 to 30 parts by weight of an LDS additive and 0.1 to 10 parts by weight of a laser marking additive per 100 parts by weight of the thermoplastic resin and the LDS additive comprises 70% by weight or more of a tin oxide.

However, it is shown that the irradiation conditions under which a plated layer can be successfully formed with the thermoplastic resin composition obtained in Comparative example 2 are considerably limited as compared with Examples 4 and 5 because it does not contain any laser marking additive.

As has been described above, it was shown that the present invention makes it possible to provide thermoplastic resin compositions that allow a plated layer to be successfully formed on the surface of resin molded articles obtained therefrom under a wider range of irradiation conditions. Thus, productivity can be improved during the formation of a plated layer on the surface of resin molded articles obtained by molding the thermoplastic resin compositions of the present invention.

SYMBOL LEGEND

1: Resin molded article; 2: Laser beam; 3: Laser-irradiated region; 4: Plating solution; 5: Plated layer.

What is claimed is:

1. A thermoplastic resin composition comprising a thermoplastic resin, and 1 to 30 parts by weight of a laser direct structuring additive and 0.1 to 10 parts by weight of a laser marking additive per 100 parts by weight of the thermoplastic resin, wherein:
    the laser direct structuring additive comprises 70% by weight or more of an oxide containing antimony and tin,
    the laser marking additive comprises at least one kind selected from an oxide containing copper and molybdenum, and an oxide containing bismuth and gallium and/or neodymium, and
    the thermoplastic resin in the thermoplastic resin composition comprises a xylylenediamine polyamide resin.

2. The thermoplastic resin composition according to claim 1, which comprises 10 to 200 parts by weight of an inorganic fiber per 100 parts by weight of the thermoplastic resin.

3. The thermoplastic resin composition according to claim 2, wherein the inorganic fiber comprises a glass fiber.

4. The thermoplastic resin composition according to claim 3, wherein the thermoplastic resin comprises a polyamide resin.

5. The thermoplastic resin composition according to claim 1, wherein the thermoplastic resin comprises a polyamide resin.

6. The thermoplastic resin composition according to claim 2, wherein the thermoplastic resin comprises a polyamide resin.

7. The thermoplastic resin composition according to claim 1, wherein the oxide containing antimony and tin contains tin in excess of antimony.

8. The thermoplastic resin composition according to claim 1, wherein the oxide containing antimony and tin contains 80% by weight or more of tin, based on a total amount of tin and antimony.

9. A resin molded article obtained by molding the thermoplastic resin composition according to claim 1.

10. The resin molded article according to claim 9, further comprising a plated layer on a surface.

11. The resin molded article according to claim 10, wherein the plated layer has performance as an antenna.

12. The resin molded article according to claim 9, which is a part for portable electronic devices.

13. A method for manufacturing a resin molded article having a plated layer, comprising irradiating a surface of a resin molded article obtained by molding the thermoplastic resin composition according to claim 1 with a laser beam, and then applying a metal to form a plated layer.

14. The method for manufacturing a resin molded article having a plated layer according to claim 13, wherein the plated layer is a copper plated layer.

15. A method for manufacturing a part for portable electronic devices, comprising a method for manufacturing a resin molded article having a plated layer according to claim 13.

* * * * *